(12) United States Patent
Hu

(10) Patent No.: US 9,295,163 B2
(45) Date of Patent: Mar. 22, 2016

(54) METHOD OF MAKING A CIRCUIT BOARD STRUCTURE WITH EMBEDDED FINE-PITCH WIRES

(71) Applicant: Dyi-Chung Hu, Chutung (TW)

(72) Inventor: Dyi-Chung Hu, Chutung (TW)

( * ) Notice: Subject to any disclaimer, the term of this patent is extended or adjusted under 35 U.S.C. 154(b) by 198 days.

(21) Appl. No.: 13/906,136

(22) Filed: May 30, 2013

(65) Prior Publication Data

US 2014/0352135 A1 Dec. 4, 2014

(51) Int. Cl.
*H05K 3/24* (2006.01)
*H05K 1/11* (2006.01)
*H05K 3/10* (2006.01)

(52) U.S. Cl.
CPC ............. *H05K 3/244* (2013.01); *H05K 1/111* (2013.01); *H05K 3/107* (2013.01); *H05K 2201/0347* (2013.01); *H05K 2201/0376* (2013.01); *Y02P 70/611* (2015.11); *Y10T 29/49002* (2015.01)

(58) Field of Classification Search
CPC ......... H05K 3/10; H05K 3/107; H05K 3/181; H05K 3/188; H05K 1/111; H05K 3/244; H05K 2201/0347; H05K 2201/0376; Y10T 29/49002; Y02P 70/611
USPC ........................................ 29/830, 846, 852
See application file for complete search history.

(56) References Cited

U.S. PATENT DOCUMENTS

| 5,592,024 | A  | * | 1/1997  | Aoyama et al. | 257/751 |
| 5,969,422 | A  | * | 10/1999 | Ting et al. | 257/762 |
| 6,008,117 | A  | * | 12/1999 | Hong et al. | 438/629 |
| 6,249,055 | B1 | * | 6/2001  | Dubin | 257/758 |
| 6,521,532 | B1 | * | 2/2003  | Cunningham | 438/687 |
| 6,551,872 | B1 | * | 4/2003  | Cunningham | 438/225 |
| 7,169,705 | B2 | * | 1/2007  | Ide et al. | 438/678 |
| 7,187,080 | B2 | * | 3/2007  | Jiang et al. | 257/751 |
| 7,470,609 | B2 | * | 12/2008 | Tsumura et al. | 438/622 |
| 7,544,609 | B2 | * | 6/2009  | Angyal et al. | 438/643 |
| 7,619,310 | B2 | * | 11/2009 | Huebinger et al. | 257/758 |
| RE41,538  | E  | * | 8/2010  | Cunningham | 438/225 |
| 2004/0238961 | A1 | * | 12/2004 | Cunningham | 257/758 |
| 2005/0023699 | A1 | * | 2/2005  | Ahn et al. | 257/762 |
| 2005/0074959 | A1 | * | 4/2005  | Burrell et al. | 438/617 |
| 2008/0052904 | A1 | * | 3/2008  | Schneider et al. | 29/846 |
| 2009/0026566 | A1 | * | 1/2009  | Oliver et al. | 257/433 |
| 2009/0098723 | A1 | * | 4/2009  | Yu | 438/614 |
| 2009/0098724 | A1 | * | 4/2009  | Yu | 438/614 |
| 2009/0188706 | A1 | * | 7/2009  | Endo | 174/257 |
| 2010/0048018 | A1 | * | 2/2010  | Gupta et al. | 438/658 |
| 2010/0084763 | A1 | * | 4/2010  | Yu | 257/737 |
| 2011/0117271 | A1 | * | 5/2011  | Barriere et al. | 427/126.2 |

(Continued)

FOREIGN PATENT DOCUMENTS

FR 2782839 A1 * 3/2000

*Primary Examiner* — Carl Arbes
(74) *Attorney, Agent, or Firm* — Hauptman Ham, LLP

(57) ABSTRACT

A formation method of circuit board structure is disclosed. The formation method comprises: forming an intermediate substrate having interconnections therein and circuit patterns on both upper and lower surfaces, wherein the interconnections electrically connect the upper and lower circuit patterns; forming an upper dielectric layer overlying the upper circuit patterns, wherein the upper dielectric layer has a plurality of trenches therein; forming conductive wires in the trenches using e-less plating; and forming at least one protective layer overlying the conductive wires using a surface finishing process. The circuit board structure features formation of embedded conductive wires in the dielectric layer so that a short circuit can be avoid.

20 Claims, 5 Drawing Sheets

(56) References Cited

U.S. PATENT DOCUMENTS

| | | | |
|---|---|---|---|
| 2011/0147940 A1* | 6/2011 | Akolkar | 257/762 |
| 2011/0260317 A1* | 10/2011 | Lu et al. | 257/737 |
| 2011/0278716 A1* | 11/2011 | Hsu et al. | 257/737 |
| 2012/0040524 A1* | 2/2012 | Kuo et al. | 438/614 |
| 2012/0261788 A1* | 10/2012 | Lin et al. | 257/506 |

* cited by examiner

METHOD OF MAKING A CIRCUIT BOARD STRUCTURE WITH EMBEDDED FINE-PITCH WIRES

FIELD OF THE INVENTION

This invention relates to a circuit board structure for BOL (bond on lead) process, and more particularly relates to a circuit board structure with embedded fine-pitch wires.

BACKGROUND OF THE INVENTION

A circuit board structure is widely applied in various electronic products, such as consumer electronic products. Because the consumer electronic products are getting more and more compact, the circuit board structure has to shrink its dimensions as well. This means that pitch, the sum of the line width $d_1$ and the spacing $d_2$ as shown in FIG. 2A, must be reduced so as to integrate more elements/devices on a more compact circuit board structure.

FIG. 1 illustrates a conventional circuit board structure. FIG. 2A and FIG. 2B are enlarged views of FIG. 1 illustrating formation of bump pads using a semi additive process. As shown in FIG. 1, the circuit board structure 1 includes an intermediate substrate 10 having interconnections 40 therein and circuit patterns (20, 30) on both upper and lower surfaces. The interconnections 40 electrically connect the upper and lower circuit patterns (20, 30). The circuit board structure 1 further includes an upper dielectric layer 50 overlying the upper circuit patterns 20. The upper dielectric layer 50 has a plurality of vias 70 for electrically connecting the upper circuit patterns 20 and an external circuit (not shown). The circuit board structure 1 further includes a lower dielectric layer 60 covering the lower circuit patterns 30. The lower dielectric layer 60 has a plurality of vias 80 for electrically connecting the lower circuit patterns 30 and the external circuit (not shown). The circuit board structure 1 further includes an upper solder mask layer 90 and bump pads 105 overlying the upper dielectric layer 50, and further includes a lower solder mask layer 100 covering the lower dielectric layer 60. The upper solder mask layer 90 and lower solder mask layer 100 respectively expose bump pads 105 and vias 80 for subsequent surface finishing process, e.g. electroless nickel electroless palladium immersion gold (ENEPIG) process. Referring to FIG. 2A, prior to the ENEPIG process, a so-called semi additive process (SAP) is used to form copper wires 13 with a spacing $d_2$, for example, of 30 μm between each other. Referring to FIG. 2B, after the ENEPIG process, bump pads 105 are made of nickel layer 14, palladium layer 15 and gold layer 16 conformally overlying the copper wires 13. The bump space $d_3$ between adjacent bump pads 105 is reduced and less than 20 μm so that a short circuit might occur.

Accordingly, a circuit board structure capable of solving the aforementioned drawbacks is desirable.

SUMMARY OF THE INVENTION

In view of the aforementioned drawbacks in prior art, one embodiment of the invention provides a circuit board structure. A formation method of circuit board structure is disclosed. The formation method comprises: forming an intermediate substrate having interconnections therein and circuit patterns on both upper and lower surfaces, wherein the interconnections electrically connect the upper and lower circuit patterns; forming an upper dielectric layer overlying the upper circuit patterns, wherein the upper dielectric layer has a plurality of trenches therein; forming conductive wires in the trenches using e-less plating; and forming at least one protective layer overlying the conductive wires using a surface finishing process.

DETAILED DESCRIPTION OF THE INVENTION

The present invention may best be understood by reference to the following description in conjunction with the accompanying drawings, in which similar reference numbers represent similar elements. Any devices, components, materials, and steps described in the embodiments are only for illustration and not intended to limit the scope of the present invention.

Figure 3:
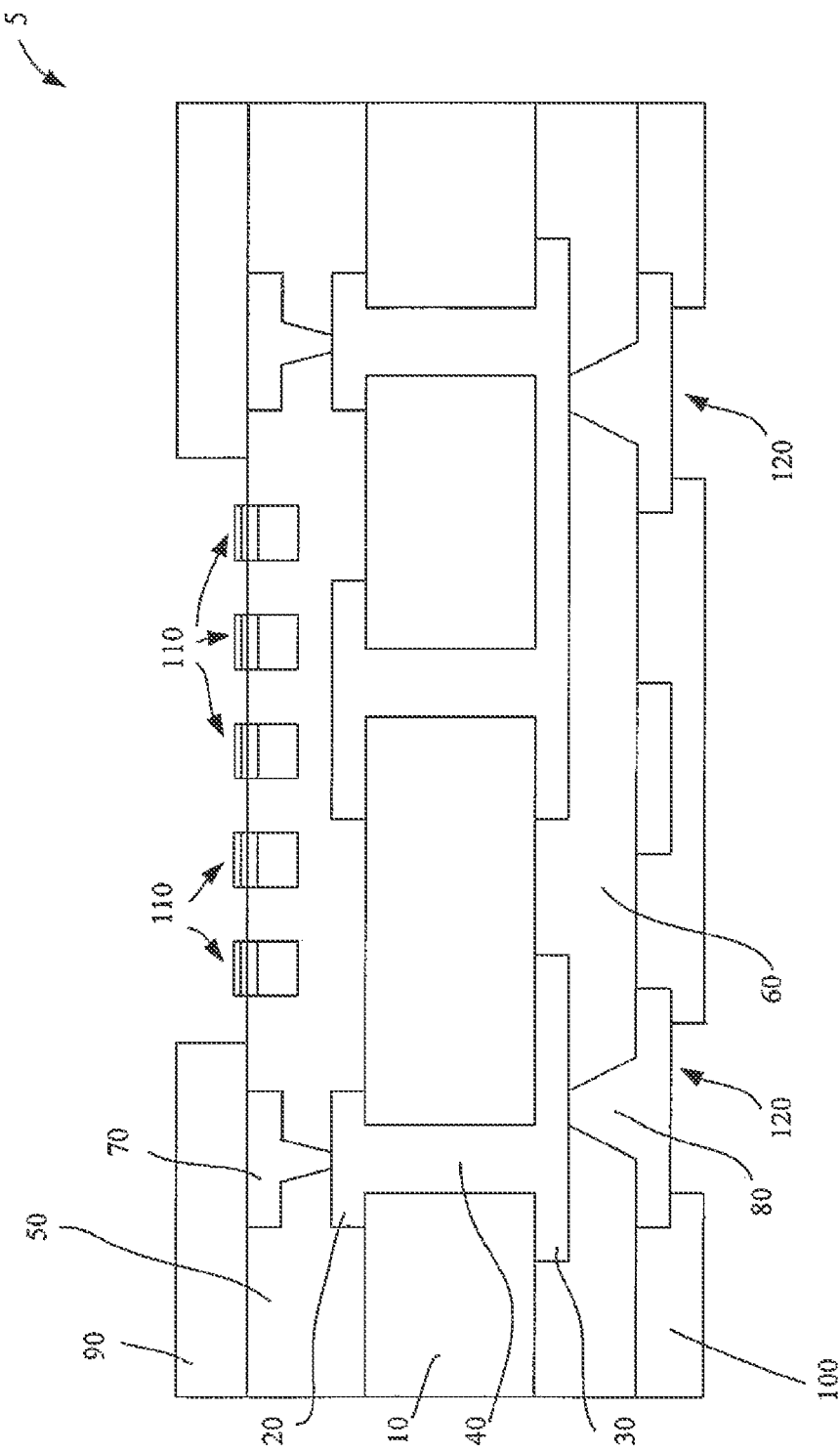
FIG. 3 illustrates a circuit board structure in accordance with one embodiment of the present invention.
Figure 4A:
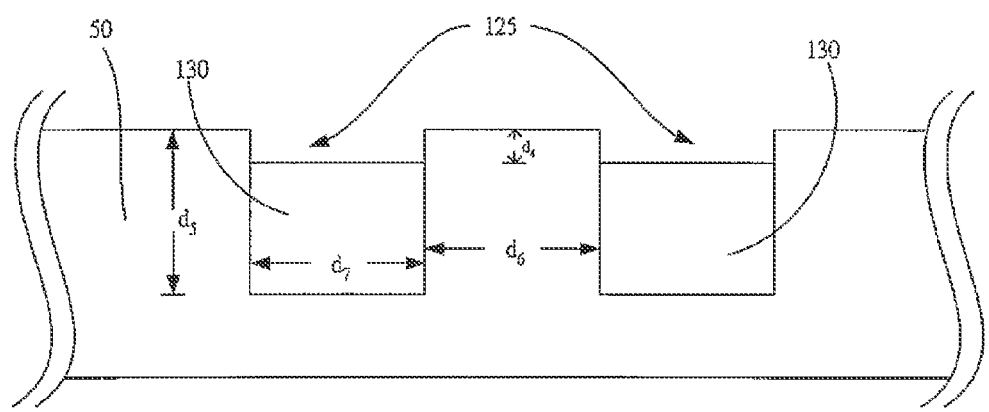
FIG. 4A and FIG. 4B are enlarged views of FIG. 3 illustrating formation of embedded fine-pitch wires.
Figure 4B:
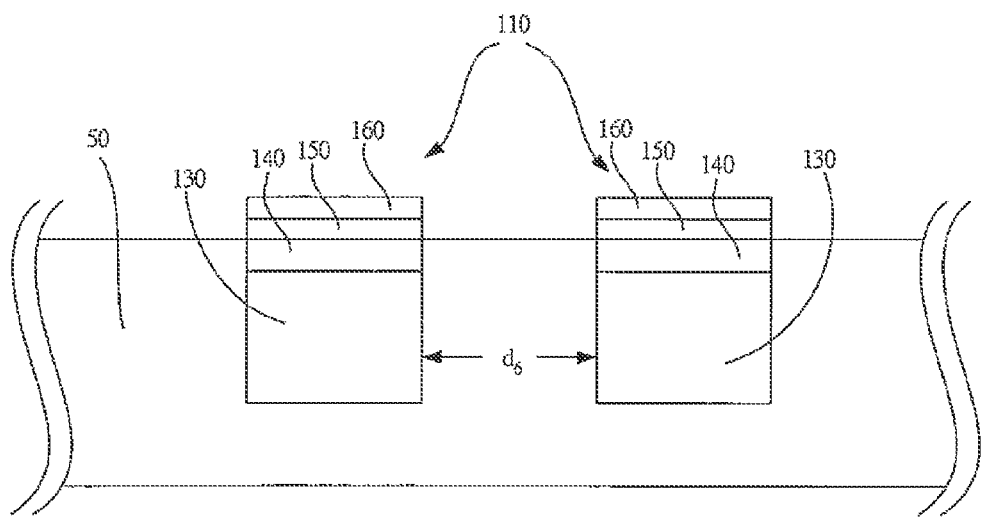

FIG. 3 illustrates a circuit board structure in accordance with one embodiment of the present invention. FIG. 4A and FIG. 4B are enlarged views of FIG. 3 illustrating formation of embedded fine-pitch wires, i.e., copper wires 130 using e-less copper plating. The circuit board structure 5 of one embodiment for the invention features formation of embedded copper wires 130 in the dielectric layer prior to formation of bump pads 110 using the surface finishing process such as ENEPIG process, as described later. In other embodiments, the surface finishing process may be electroless nickel immersion gold (ENIG) process, electroless nickel electroless gold (ENEG) process, organic solder preservative (OSP) process, immersion silver process, immersion tin process, or hot air solder leveling (HASL) process.

Figure 1:
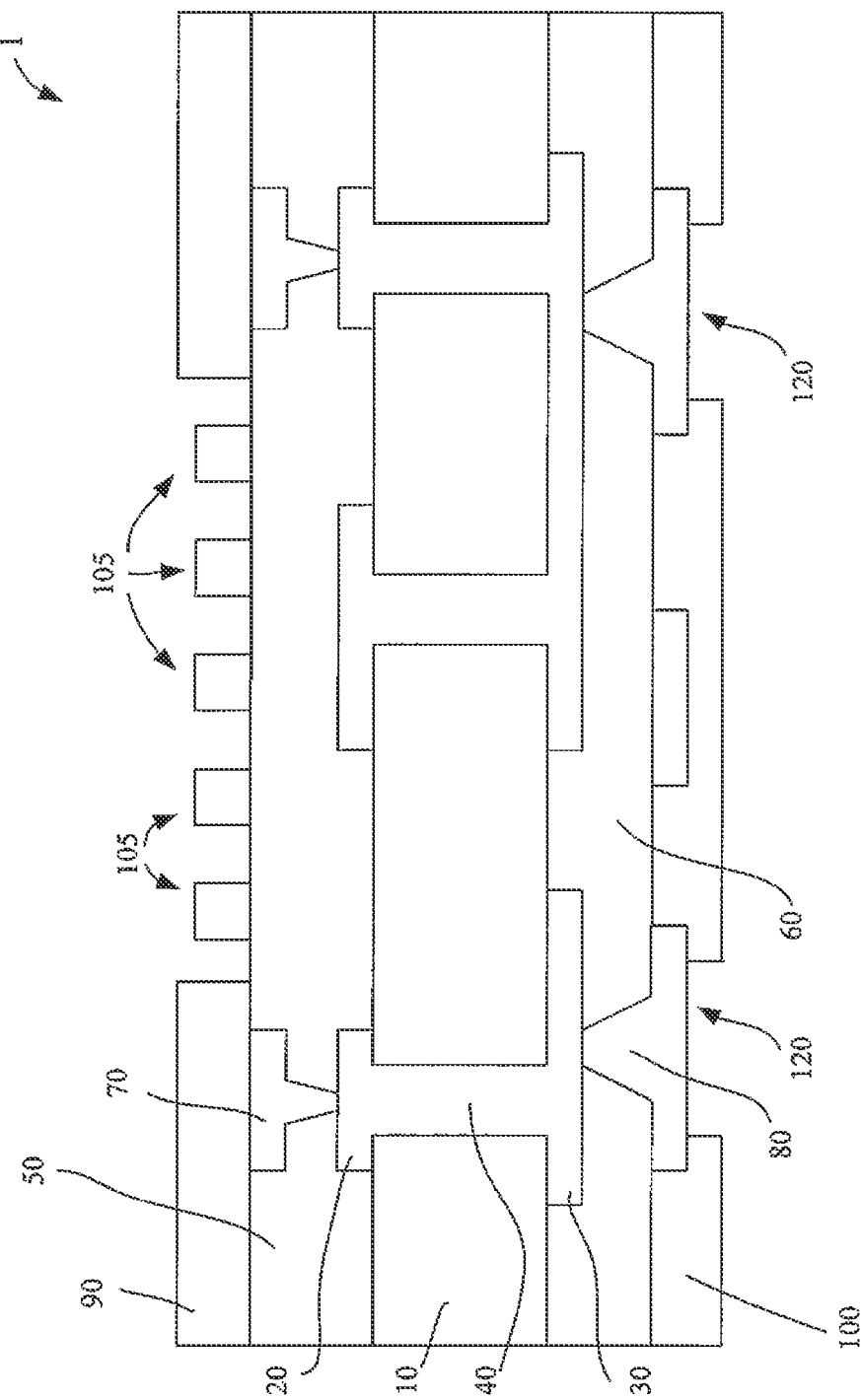
FIG. 1 illustrates a conventional circuit board structure.
Figure 2A:
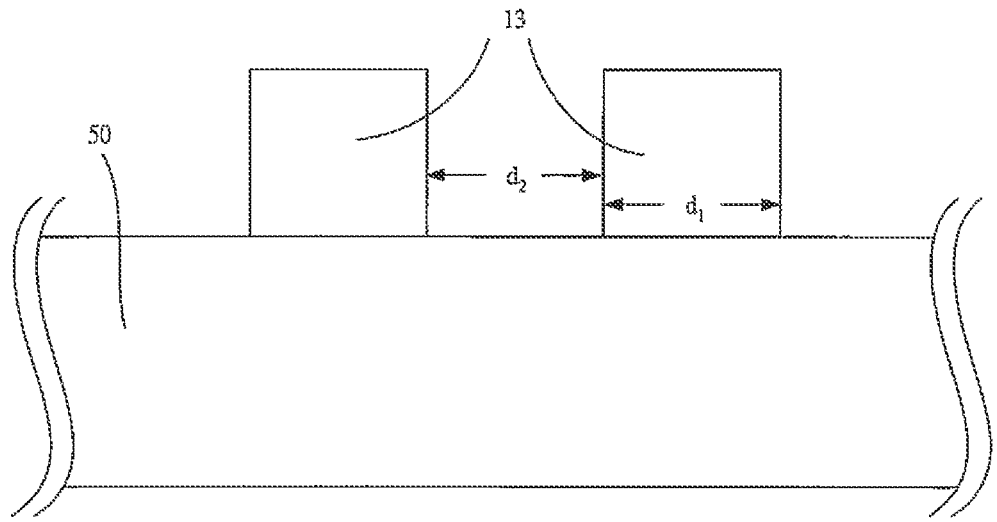
FIG. 2A is an enlarged view of FIG. 1 illustrating copper wires formed by a semi additive process.
Figure 2B:
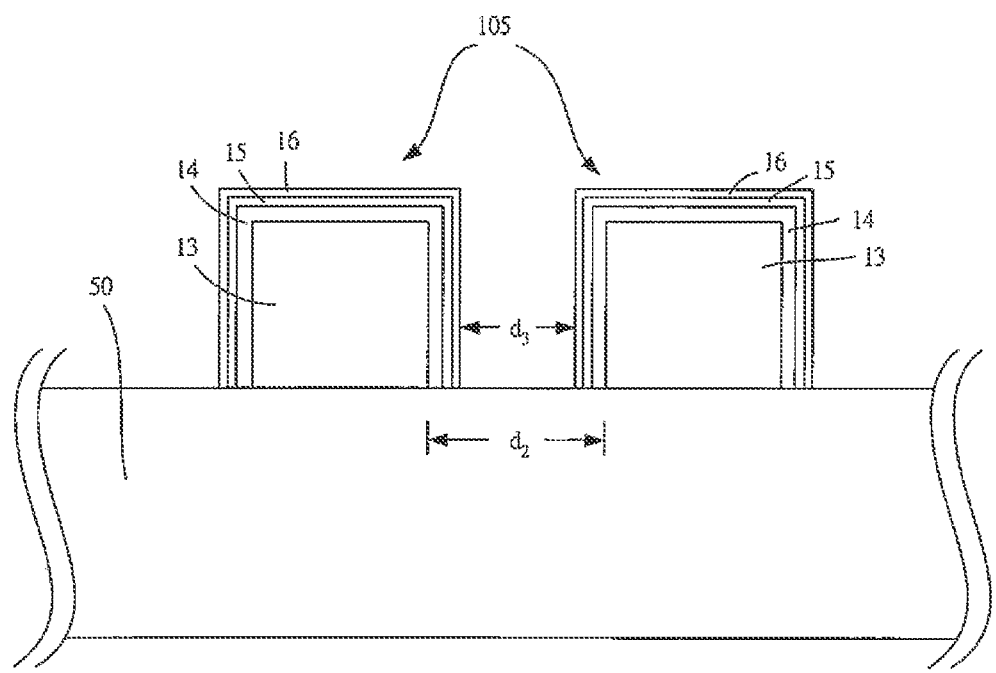
FIG. 2B is an enlarged view of FIG. 1 illustrating bump pads formed by a surface finishing process.

As shown in FIG. 3, the circuit board structure 5 of this embodiment includes an intermediate substrate 10 having interconnections 40 therein and circuit patterns (20, 30) on both upper and lower surfaces. The interconnections 40 electrically connect the upper and lower circuit patterns (20, 30). The circuit board structure further includes an upper dielectric layer 50 overlying the upper circuit patterns 20. The upper dielectric layer 50 has a plurality of vias 70 for electrically connecting the upper circuit patterns 20 and an external circuit (not shown). The circuit board structure further includes a lower dielectric layer 60 covering the lower circuit patterns 30. The lower dielectric layer 60 has a plurality of vias 80 for electrically connecting the lower circuit patterns 30 and the external circuit (not shown). The circuit board structure 5 further includes an upper solder mask layer 90 and bump pads 105 overlying the upper dielectric layer 50, and further includes a lower solder mask layer 100 covering the lower dielectric layer 60. The upper solder mask layer 90 and lower solder mask layer 100 respectively expose bump pads 110 and vias 80 for subsequent surface finishing process, e.g. electroless nickel electroless palladium immersion gold (ENEPIG) process. In other embodiments, the surface finishing process may be electroless nickel immersion gold (ENIG) process, electroless nickel electroless gold (ENEG) process, organic solder preservative (OSP) process, immersion silver process, immersion tin process, or hot air solder leveling (HASL) process. The circuit board structure 5 of this embodiment differs from that shown in FIG. 1 in formation of embedded copper wires 130. That is, the copper wires 130 are embedded in the upper dielectric layer 50 instead of being formed on/over the upper dielectric layer. Referring to FIG. 3 again, the embedded copper wires 130 can be formed in the circuit board structure 5 using a so-called coreless process or other well-known processes.

As shown in FIG. 4A, prior to the ENEPIG process, the embedded copper wires 130 with a spacing $d_6$ of 30 μm between each other are deposited in the upper dielectric layer 50. The embedded copper wires 130 are formed in trenches having a depth $d_5$ of 20 μm. Noted that a spacing 125 with a depth $d_4$ ranging from 3 to 7 μm is left for subsequent formation of bump pads using the ENEPIG process. Noted that the pitch, i.e. the sum of the line width $d_7$ and the spacing $d_6$, may range between 2 μm and 40 μm in accordance with various embodiments.

Referring to FIG. 4B, after the ENEPIG process, the bump pads 110 are made of nickel layer 140, palladium layer 150 and gold layer 160 overlying the embedded copper wires 130. The bump space $d_6$ between adjacent bump pads 110 remains unchanged, i.e. 30 μm so that a short circuit can be avoid. In other embodiments, the bump space $d_6$ may be less or larger than 30 μm.

Figure 5A:
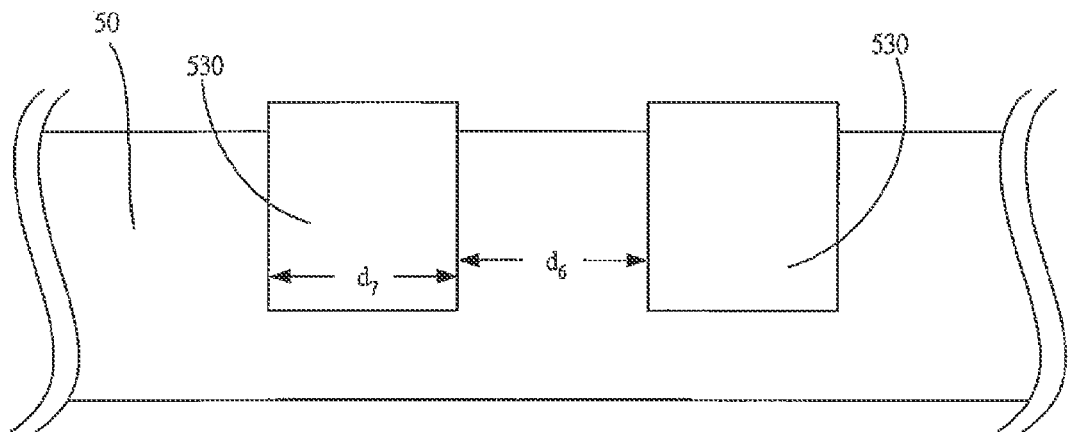
FIG. 5A is an enlarged view of FIG. 3 illustrating formation of copper wires with a surface higher than that of the dielectric layer.
Figure 5B:
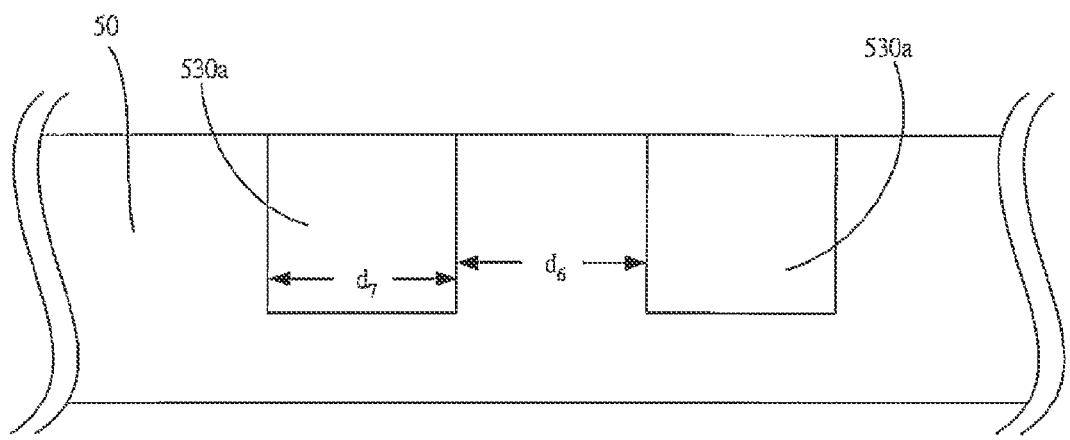
FIG. 5B illustrates that the surface of copper wires as shown in FIG. 5A is substantially coplanar with that of the dielectric layer after chemical mechanical polishing or grinding.

Referring to FIGS. 5A and 5B, the embedded copper wires 530a can be alternatively formed by other processes. As shown in FIG. 5A, the copper wires 530 are formed with a surface higher than that of the dielectric layer 50. As shown in FIG. 5B, the copper wires 530 are subsequently subject to a planarization process such as a chemical mechanical polishing or grinding so that the surface of embedded copper wires 530a is substantially coplanar with that of the dielectric layer 50. Thereafter, the aforementioned surface finishing process is performed on the embedded copper wires 530a.

Although specific embodiments have been illustrated and described, it will be obvious to those skilled in the art that various modifications may be made without departing from what is intended to be limited solely by the appended claims.

The invention claimed is:

1. A formation method of circuit board structure, comprising:
    forming an intermediate substrate having interconnections therein and circuit patterns on both upper and lower surfaces of the intermediate substrate, wherein the interconnections electrically connect the upper and lower circuit patterns;
    forming an upper dielectric layer overlying the upper circuit patterns, wherein the upper dielectric layer has a plurality of trenches therein;
    forming conductive wires in the trenches using e-less plating, wherein each of the conductive wires formed by e-less plating fills more than half of a volume of a corresponding one of the plurality of trenches; and
    forming at least one protective layer overlying the conductive wires using a surface finishing process,
    wherein
    a top surface of each of the conductive wires is lower than a top surface of the upper dielectric layer so that a spacing in each of the trenches is left above the corresponding conductive wire, and
    said forming the at least one protective layer includes filling up the spacing using the surface finishing process.

2. The formation method of claim 1, wherein the surface finishing process is selected from the group consisting of
    electroless nickel electroless palladium immersion gold (ENEPIG) process,
    electroless nickel immersion gold (ENIG) process,
    electroless nickel electroless gold (ENEG) process,
    organic solder preservative (OSP) process, immersion silver process,
    immersion tin process, and
    hot air solder leveling (HASL) process.

3. The formation method of claim 1, wherein the at least one protective layer is a single layer of a material selected from the group consisting of nickel, palladium, gold, silver, tin, and combinations thereof.

4. The formation method of claim 1, wherein the at least one protective layer comprises multiple layers of materials selected from the group consisting of nickel, palladium, gold, silver, tin, and combinations thereof.

5. The formation method of claim 1, wherein the spacing has a depth ranging between 3 and 7 μm.

6. The formation method of claim 1, wherein, in said forming the at least one protective layer, the at least one protective layer is formed to cover only the top surfaces of the conductive wires, without covering the top surface of the upper dielectric layer.

7. The formation method of claim 6, wherein, in said forming the at least one protective layer, the at least one protective layer is formed to cover only the top surfaces of the conductive wires, without covering side surfaces of the conductive wires.

8. The formation method of claim 1, wherein, in said forming the at least one protective layer,
    the at least one protective layer comprises multiple layers, and
    at least a lowermost layer among the multiple layers is completely located within the spacing above each of the conductive wires.

9. The formation method of claim 8, wherein, in said forming the at least one protective layer, at least an uppermost layer among the multiple layers
    is located outside the spacing above each of the conductive wires, and
    covers only the top surfaces of the conductive wires, without covering the top surface of the upper dielectric layer and without covering side surfaces of the conductive wires.

10. The formation method of claim 1, wherein said forming the upper dielectric layer having the trenches therein, said forming the copper wires in the trenches using e-less copper plating, and said forming the at least one protective layer are performed in the recited order.

11. A formation method of circuit board structure, comprising:
    forming an intermediate substrate having interconnections therein and circuit patterns on both upper and lower surfaces, wherein the interconnections electrically connect the upper and lower circuit patterns;
    forming an upper dielectric layer overlying the upper circuit patterns, wherein the upper dielectric layer has a plurality of trenches therein;
    forming copper wires in the trenches using e-less copper plating, wherein a top surface of the conductive wires is higher than a top surface of the upper dielectric layer;

performing a planarization process on the top surface of the conductive wires until the top surface of the conductive wires is substantially coplanar with the top surface of the upper dielectric layer; and forming at least one protective layer that is higher than the top surface of the upper dielectric layer and covers the top surface of the conductive wires only, without overlapping the top surface of the upper dielectric layer in a thickness direction of the intermediate substrate.

12. The formation method of claim 11, wherein said forming the upper dielectric layer having the trenches therein, said forming the copper wires in the trenches using e-less copper plating, said performing the planarization process, and said forming the at least one protective layer are performed in the recited order.

13. The formation method of claim 12, wherein, in said forming the copper wires in the trenches, the copper wires are formed by e-less copper plating to completely fill the trenches and then extend upwardly beyond, without covering, the top surface of the upper dielectric layer.

14. The formation method of claim 13, wherein, in said forming the at least one protective layer, the at least one protective layer is formed by a surface finishing process selected from the group consisting of electroless nickel electroless palladium immersion gold (ENEPIG) process, electroless nickel immersion gold (ENIG) process, electroless nickel electroless gold (ENEG) process, organic solder preservative (OSP) process, immersion silver process, immersion tin process, and hot air solder leveling (HASL) process.

15. The formation method of claim 11, wherein the at least one protective layer is a single layer of a material selected from the group consisting of nickel, palladium, gold, silver, tin, and combinations thereof.

16. The formation method of claim 11, wherein the at least one protective layer comprises multiple layers of materials selected from the group consisting of nickel, palladium, gold, silver, tin, and combinations thereof.

17. A formation method of circuit board structure, comprising:

forming an intermediate substrate having interconnections therein and circuit patterns on both upper and lower surfaces of the intermediate substrate, wherein the interconnections electrically connect the upper and lower circuit patterns;

forming an upper dielectric layer overlying the upper circuit patterns, wherein the upper dielectric layer has a plurality of trenches therein;

forming conductive wires in the trenches, wherein each of the conductive wires is formed until said conductive wire fills more than half of a volume of a corresponding trench among the plurality of trenches, and a top surface of said conductive wire is still lower than a top surface of the upper dielectric layer so that a spacing in the corresponding trench is left above said conductive wire; and forming at least one protective layer overlying each of the conductive wires and completely filling up the spacing in the corresponding trench left above said conductive wire.

18. The formation method of claim 17, wherein, in said forming the at least one protective layer, the at least one protective layer comprises multiple layers, and at least a lowermost layer among the multiple layers is completely located within the spacing above the corresponding conductive wire.

19. The formation method of claim 18, wherein, in said forming the at least one protective layer, at least an uppermost layer among the multiple layers is located outside the spacing above the corresponding conductive wire, and covers only the top surface of the corresponding conductive wire, without covering the top surface of the upper dielectric layer and without covering side surfaces of the corresponding conductive wire.

20. The formation method of claim 17, wherein a lowermost surface of each of the conductive wires is in direct contact with the upper dielectric layer at a bottom of a corresponding trench among the plurality of trenches.

* * * * *